(12) United States Patent
Gotoh et al.

(10) Patent No.: US 7,651,940 B2
(45) Date of Patent: Jan. 26, 2010

(54) ELECTRONIC PART PRODUCING METHOD AND ELECTRONIC PART

(75) Inventors: Masashi Gotoh, Tokyo (JP); Kaoru Kawasaki, Tokyo (JP); Hiroshi Yamamoto, Tokyo (JP); Mutsuko Nakano, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/537,286

(22) PCT Filed: Dec. 2, 2003

(86) PCT No.: PCT/JP03/15396

§ 371 (c)(1),
(2), (4) Date: Jun. 1, 2005

(87) PCT Pub. No.: WO2004/052063

PCT Pub. Date: Jun. 17, 2004

(65) Prior Publication Data

US 2006/0057819 A1    Mar. 16, 2006

(30) Foreign Application Priority Data

Dec. 2, 2002    (JP) ............................. 2002-349838

(51) Int. Cl.
*H01L 21/4763* (2006.01)
(52) U.S. Cl. ..................... 438/624; 438/778
(58) Field of Classification Search ............... 257/737; 174/265; 438/115, 624, 778; 216/13
See application file for complete search history.

(56) References Cited

U.S. PATENT DOCUMENTS

| | | | | |
|---|---|---|---|---|
| 5,049,221 A | * | 9/1991 | Wada et al. ................. | 156/151 |
| 5,480,048 A | * | 1/1996 | Kitamura et al. ............... | 216/13 |
| 5,600,103 A | * | 2/1997 | Odaira et al. ................ | 174/265 |
| 5,970,319 A | * | 10/1999 | Banks et al. ................. | 438/115 |
| 6,629,366 B1 | | 10/2003 | Kobayashi | |
| 6,930,388 B2 | * | 8/2005 | Yamaguchi et al. ......... | 257/737 |
| 7,237,332 B2 | * | 7/2007 | Kawashima et al. .......... | 29/830 |

FOREIGN PATENT DOCUMENTS

| | | |
|---|---|---|
| EP | 0 620 701 | 10/1994 |
| EP | 1 079 676 | 2/2001 |
| JP | 5-299816 | 11/1993 |
| JP | 06-350258 | 12/1994 |

(Continued)

OTHER PUBLICATIONS

U.S. Appl. No. 10/546,873, filed Aug. 25, 2005, Gotoh et al.

*Primary Examiner*—Leonardo Andújar
*Assistant Examiner*—Monica D Harrison
(74) *Attorney, Agent, or Firm*—Oblon, Spivak, McClelland, Maier & Neustadt, L.L.P.

(57) ABSTRACT

A conductor portion is formed on the surface of a support member. After the conductor portion is formed, a copper foil on which resin is attached is moved downward from above the conductor portion to pressurize the conductor portion while covering it. the copper foil with the resin is pressed to the height of the conductor potion while using the conductor portion as a stopper. Thus, it is possible to make the height of the insulating layer equal to the height of the conductor portion.

13 Claims, 3 Drawing Sheets

FOREIGN PATENT DOCUMENTS

| | | |
|---|---|---|
| JP | 7-111375 | 4/1995 |
| JP | 8-125334 | 5/1996 |
| JP | 8-195560 | 7/1996 |
| JP | 10-022636 | 1/1998 |
| JP | 2000-13028 | 1/2000 |
| JP | 2000-299404 | 10/2000 |
| JP | 2001-28477 | 1/2001 |
| JP | 2001-068850 | 3/2001 |
| JP | 2001-177237 | 6/2001 |
| JP | 2001-284801 | 10/2001 |
| JP | 2001-326459 | 11/2001 |
| JP | 2002-076578 | 3/2002 |
| JP | 2002-134881 | 5/2002 |
| JP | 2002-137328 | 5/2002 |

* cited by examiner

ELECTRONIC PART PRODUCING METHOD AND ELECTRONIC PART

TECHNICAL FIELD

The present invention relates to an electronic part and a method for manufacturing an electronic part having a multilayer structure, and more particularly, to an electronic part and a method for manufacturing an electronic part with which the thickness of each layer can be adjusted reliably.

BACKGROUND ART

Electronic parts and printed wiring boards in which wiring patterns are formed on insulating layers and the wiring patterns are stacked along their thickness direction to form a multilayer structure have been known.

Various methods for manufacturing such structures have been proposed or disclosed. FIGS. 3A and 3B are process diagrams illustrating a conventional process of producing each layer of an electronic part.

In the process shown in FIG. 3A, the surface of an insulating layer 1 is irradiated with a laser so as to be perforated. After a hole 2 is formed by the laser processing, the hole 2 is filled with paste, or a conductor portion in the form of a film or a column is formed in the hole 2.

In the process shown in FIG. 3B, a conductor portion 4 is formed by plating or etching on an insulating layer 3, which has been formed in advance. After the conductor portion 4 is formed by the above processes, an insulating resin 5 is applied on the surface of the conductor portion 4 by spin coating (see, for example, patent document 1).

In a different known method, a bump of an electrically conductive paste is formed on wiring on a board, then an interlaminate connection insulating material and a metal layer are provided, and the bump is caused to penetrate a molded resin by a pressing process to achieve electrical connection between said bump and the metal layer (see, for example, patent document 2).

Furthermore, a method of forming a via hole conductor by forming a through hole by means of a carbon dioxide gas laser or other means and filing the through hole with paste containing powder of a low resistance metal such as gold, silver, copper and aluminum has also been disclosed (see, for example, patent document 3).

Patent Document 1: Japanese Patent Application Laid-Open No. 10-22636.
Patent Document 2: Japanese Patent Application Laid-Open No. 2002-137328.
Patent Document 3: Japanese Patent Application Laid-Open No. 2002-134881.

In connection with electronic parts having a multilayer structure, incorporation of an element etc. in the interior of the electronic part has been considered in order to further increase density and functions. If an element such as a passive component is to be formed between wiring patterns stacked along the lamination direction, the distance between the aforementioned wiring patterns is an important factor that determines characteristics of the aforementioned element. Accordingly, from the viewpoint of stabilization of the element characteristics, a method for manufacturing an electronic part that enables reliable control of the distance between the aforementioned wiring patterns or the thickness of each layer in the aforementioned electronic part has been demanded.

Nevertheless, in the above-mentioned manufacturing method shown in FIG. 3A, a conductor portion is simply formed in a hole 2 formed on an insulating layer 1 by a laser processing, but the overall thickness of the layers is not controlled.

In the manufacturing method shown in FIG. 3B, an insulating resin layer is formed to cover conductor portions by applying resin by spin coating. However, undulation is created on the surface of the insulating resin due to presence of the conductor portions 4, and therefore it is difficult to make the overall thickness of the layers uniform.

Furthermore, in the method in which a bump of electrically conductive paste is formed on wiring on a board and then the bump is caused to penetrate a molded resin by pressing, no consideration has been made on control of the overall thickness of the layers. Still further, Japanese Patent Application Laid-Open No. 2002-134881 only teaches to form a via hole conductor by filling paste, but no consideration is made on control of the overall thickness of the layers.

DISCLOSURE OF THE INVENTION

The present invention has been made in view of the above-described problems of the prior arts. An object of the present invention is to provide a method for manufacturing an electronic part with which the layer thickness can be controlled reliably, and to provide an electronic part manufacture using that method.

The present invention has been made based on the finding that when a conductor portion is formed on the surface of a support member and an insulating member is pressed against the conductor portion from above while using the conductor portion as a stopper, the thickness of the insulating member will be made equal to the height of the conductor portion, so that unevenness (or undulation) can be suppressed to the minimum and a layer having a uniform thickness can be formed.

In the method for manufacturing an electronic part according to the present invention, a layer having a uniform thickness is formed by forming a conductor portion on a surface of a support member, bringing an insulating sheet into contact with said conductor portion from above, and pressing said insulating sheet to the height of said conductor portion using said conductor portion as a stopper to make the height of said insulating sheet equal to the height of said conductor portion.

Alternatively, a layer having a uniform thickness is formed by forming a conductor portion on a surface of a support member, bringing an insulating sheet into contact with said conductor portion from above, pressing said insulating sheet to the height of said conductor portion using said conductor portion as a stopper to make the height of said insulating sheet equal to the height of said conductor portion, and then detaching said conductor portion and said insulating sheet from said surface.

More specifically, a layer having a uniform thickness is formed by forming a power supply film on a surface of a support member, forming a conductor portion by plating using the power supply film as an electrode, bringing an insulating sheet into contact with said conductor portion from above, pressing said insulating sheet to the height of said conductor portion using said conductor portion as a stopper to make the height of said insulating sheet equal to the height of said conductor portion, then detaching said conductor portion and said insulating sheet from said surface, and removing said power supply film.

It is preferred that a B-stage sheet or a thermoplastic sheet be used as said insulating sheet.

An electronic part according to the present invention comprises, at least, a conductor portion having an interior completely filled up and rising from vertically from a surface of a support member and an insulating layer surrounding the circumference of said conductor portion and having a thickness equal to said conductor portion, wherein said conductor portion and said insulating layer form a layer having a uniform thickness.

Alternatively, an electronic part according to the present invention comprises, at least, a conductor portion having an interior completely filled up and rising from vertically from the bottom of a support member and an insulating layer surrounding the circumference of said conductor portion and having a thickness equal to said conductor portion, said conductor portion and said insulating layer forming a layer having a uniform thickness. It is preferred that said conductor portion be formed by plating.

According to the above-described features, a conductor portion is firstly formed on the surface of a support member that can be detached. The conductor portion may be formed by, for example, plating using a power supply film. When the conductor portion is formed by plating, the circumferential surface of the conductor portion rises substantially vertically from said insulating layer. Accordingly, it is possible to eliminate changes in the diameter between the top portion and the bottom portion of the conductor portion. In addition, it is possible to make the interior of the conductor member solid. Therefore, it is possible to make the resistivity of the conductor portion low and to enhance the heat radiation effect.

After the conductor portion has been formed on the surface of the insulating layer, an insulating sheet is brought into contact with the conductor portion from above so that the conductor portion is covered by the insulating sheet, and the insulating sheet is pressurized (and heated) from above. With the application of the pressure, the conductor portion dents into the insulating sheet with deformation of the insulating sheet. The pressurizing means uses the conductor portion as a stopper to stop pressurizing when the insulating sheet comes in contact with said conductor portion. Thus, the thickness of the insulating sheet can be made equal to the height of the conductor portion. The insulating sheet is cured while maintaining this state, so that the insulating sheet becomes an insulating layer. Thus, a uniform layer thickness can be realized irrespective of presence/absence of the conductor portion.

THE BEST MODE FOR CARRYING OUT THE INVENTION

In the following, a preferred, specific embodiment of the method for manufacturing an electronic part according to the present invention will be described in detail.

FIGS. 1A to 1C and 2A to 2C schematic process diagrams for illustrating an embodiment of the method of manufacturing an electronic part according to the present invention.

Figure 1A:
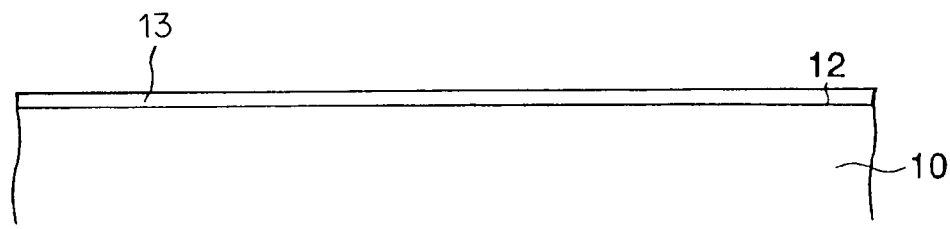
FIGS. 1A, 1B and 1C are schematic process diagrams for illustrating a method for manufacturing an electronic part according to an embodiment.
Figure 1B:
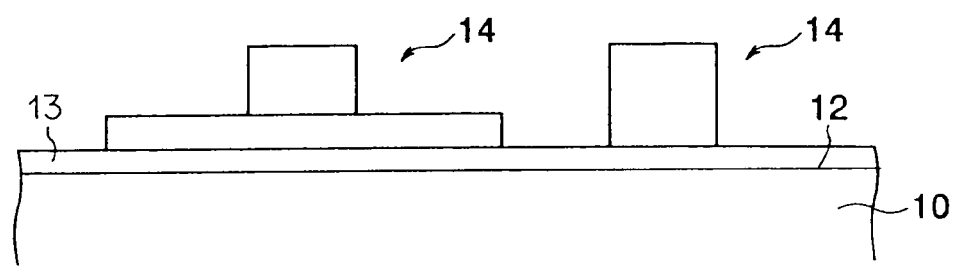
Figure 1C:
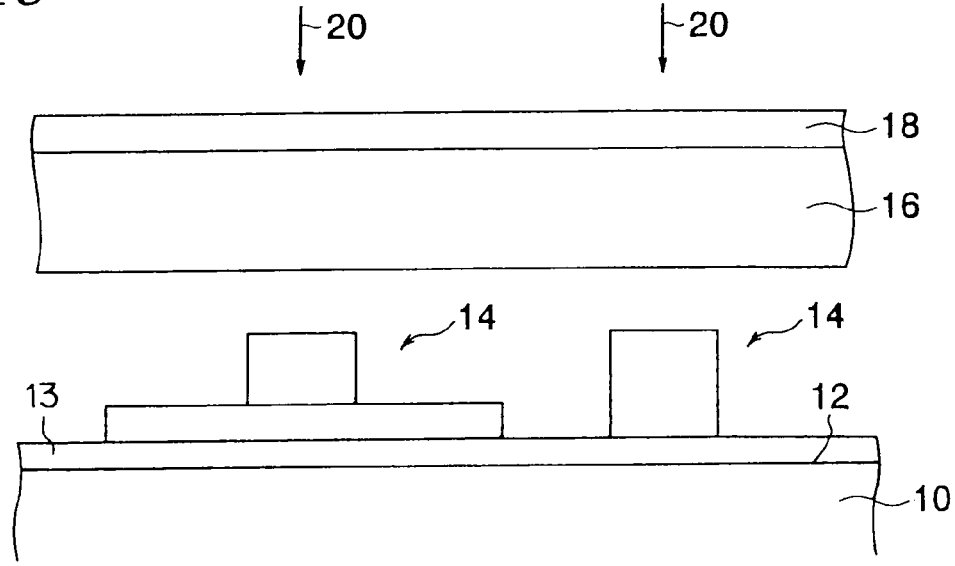

In producing an electronic part by the manufacturing method of this embodiment, a support member 10 that can be detached from the part is prepared as shown in FIG. 1A; the support member is set with the surface 12 for forming the electronic part facing upwardly. After the support member 10 is set, conductor portions 14 are formed on the aforementioned surface 12 as shown in FIG. 1B. It will be apparent that the configuration of the conductor portion 14 standing on the aforementioned surface 12 is the same as the configuration of the aforementioned conductor portion 14 standing on the bottom face of the body of the part, since the surface 12 and the bottom face of the body of the part formed on this surface 12 are in close contact with each other. The characteristics of the aforementioned support member 10 are selected in accordance with the specification of the electronic part formed on the surface of the support member 10. Specifically, in the later-described case in which the electronic part is detached from the aforementioned support member 10, it is preferred to use, for example, a stainless steel plate that has superior anticorrosion properties. On the other hand, in the case that the electronic part is not detached from the aforementioned support member, in other words in the case that the support member is a substrate and an electronic part is formed on the surface thereof, it is desirable that the support member be an insulating member. On the surface 12, a electric power supply layer 13 for allowing plating operation, which will be described later, is formed.

The configuration of the conductor portion 14 is not limited to a column-like shape standing on the surface 12, but various configurations, such as a conductor portion composed of a wiring portion having a different thickness as shown in the drawing and column-like conductor standing on the wiring portion, may be adopted.

Referring to the conductor 14, a resist film (not shown) is firstly formed on the aforementioned surface 12. After that, holes corresponding to the aforementioned conductor portions 14 are formed on the resist film by photo etching. After the holes are formed on the resist film, the holse are subjected to a plating process, so that conductor metal is deposited by electrolytic plating using the aforementioned electric power supply film 13 as an electrode. With the above-described process, conductor portions 14 having the interior completely filled up and rising substantially vertically from the surface 12 can be formed. In connection with this, in the case that a conductor portion is composed of a wiring portion and a column-like conductor as described above, photo etching should be performed separately for the wiring portion and the column-like conductor.

After the conductor portions 14 are formed on the surface 12 of the support member 10, a thermoplastic insulating sheet or a copper foil 18 on which resin 16 is attached serving as a thermosetting insulating sheet in a B-stage condition is caused to descend from above the conductor portions 14 along the direction indicated by arrow 20. The aforementioned resin 16 may preferably be a thermoplastic resin compound such as polyolefin, fluorocarbon resin, liquid crystal polymer, polyetherketone and polyphenylene sulfide or a thermosetting resin such as a unsaturated polyester resin, polyimide resin, epoxy resin, bismaleimide triazine resin, phenol resin, polyphenylene oxide and polyvinyl benzilether. The B-stage sheet refers to such a sheet that is in the state in which curing of the thermosetting resin is stopped halfway, and when heated further, it will be once melted and eventually cured completely.

It is more preferable that the temperature in heating be higher than the melting point or softening point of the resin. On the side of the copper foil that is opposite to the side on which the resin 16 is formed, there is provided pressurizing means for pressing the copper foil 18 with the resin 16, although it is not shown in the drawings. Thus, it is possible to press the copper foil 18 with the resin 16 against the support member while heating it under a reduced pressure condition (namely, so-called heat pressing under vacuum is performed).

Figure 2A:
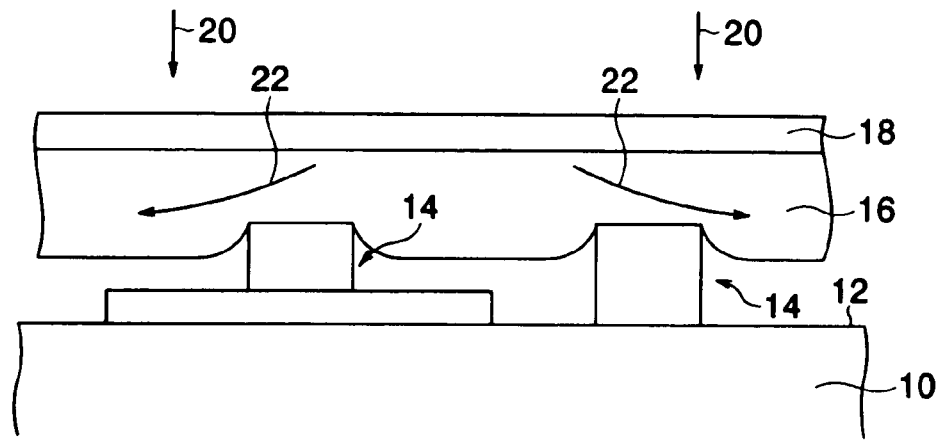
FIGS. 2A, 2B and 2C are schematic process diagrams for illustrating the method for manufacturing an electronic part according to the embodiment.
Figure 2B:
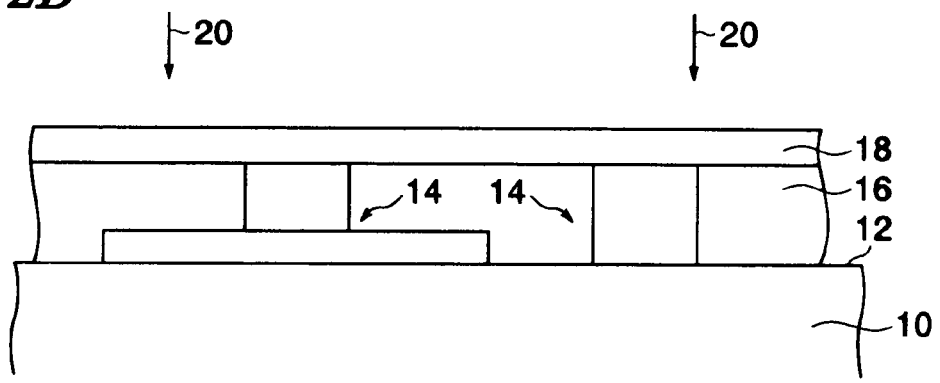

When the copper foil 18 with the resin 16 is moved down in the direction indicated by arrow 20, the copper foil with the resin comes in contact with the conductor portions 14. As the downward movement of the copper foil 18 with the resin 16 further progresses, the resin 16 is pressed by the conductor portions 14 to move in the directions indicated by arrows 22 and the conductor portions 14 dent into the resin 16. FIG. 2A shows this state. When the copper foil 18 with the resin 16 is further moved down after the conductor portions 14 have dented into the resin 16, the conductor portions 14 dent into the resin further and eventually come in contact with the copper foil 16 as shown in FIG. 2B.

Figure 2C:
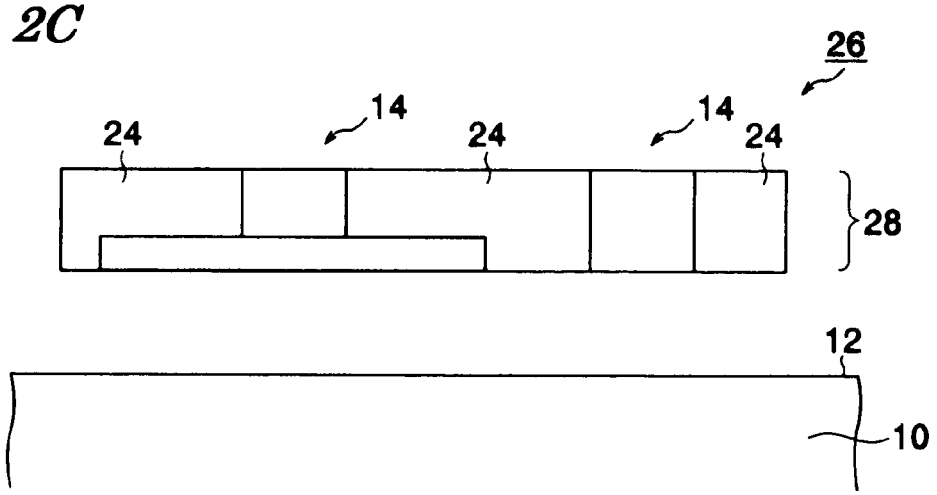
Figure 3A:
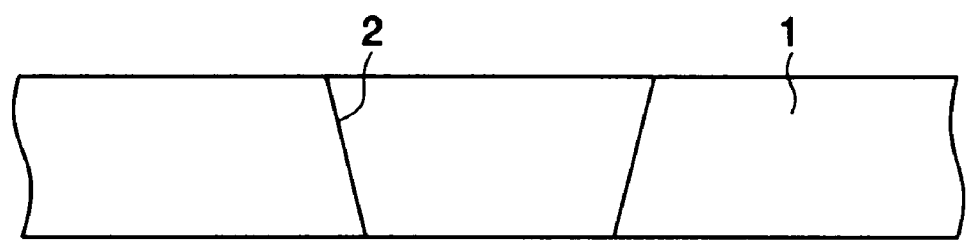
FIGS. 3A and 3B are process diagrams showing a conventional process for manufacturing each layer of an electronic part.
Figure 3B:
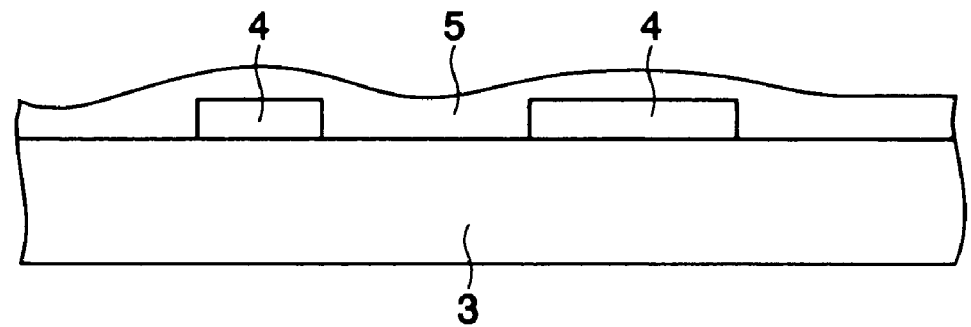

When the top of the conductor portions 14 comes in contact with the copper foil 18, the conductor portions 14 function as a stopper to receive the pressing force from the pressurizing means to stop the downward movement of the pressurizing means. Upon detection of the stoppage of the downward movement of the pressurizing means, it is assumed that the conductor portions 14 have come in contact with the copper foil 18, and the descending operation is terminated accordingly. The contact of the top of the conductor portions 14 and the copper foil 18 is maintained until the resin 16 is cured. After the resin 16 has been cured to form an insulating layer 24 surrounding the circumference of the conductor portions 14, the pressurizing means is moved away upwardly. After that, the copper foil 18 is removed from the insulating layer 24, unused portions around the conductor portions 14 are cut off, and the conductor portions 14 and the insulating layer 24 are detached from the surface of the support member 10. Thus, the height of the insulating layer 24 can be made equal to the height of the conductor portions 14, and the thickness of the layer 28 in the electronic part 26 can be made uniform as shown in FIG. 2C.

As described the above, according to the present invention, a layer having a uniform thickness is formed by forming conductor portions on the surface of a support member, bringing an insulating sheet into contact with the conductor portions from above, and pressing the insulating sheet to the height of the conductor portions using the conductor portions as a stopper to make the height of the insulating sheet equal to the height of the conductor portions, or a layer with a uniform thickness including at least a conductor portions having the interior completely filled up and rising vertically from the bottom of the body of a part and an insulating layer surrounding the circumference of the conductor portions and having a height equal to the height of the conductor portion is formed. Thus, it is possible to eliminate unevenness and control the layer thickness of an electronic part reliably. In addition, it is possible to reduce the resistivity of the conductor portions and to enhance the heat radiation effect.

What is claimed is:

1. A method for manufacturing an electronic part in which a layer having a uniform thickness is formed, the method comprising:
    forming a power supply film on a surface of a support member;
    forming at least one conductor portion by plating using the power supply film as an electrode;
    bringing an insulating sheet attached on a copper foil into contact with the at least one conductor portion from above;
    pressing by a pressurizing means the copper foil together with the insulating sheet up to a height of the at least one conductor portion; and
    removing said power supply film.

2. A method for manufacturing an electronic part according to claim 1, wherein said at least one conductor portion and said insulating sheet are detached from said surface, after making the height of said insulating sheet equal to the height of said at least one conductor portion.

3. A method of manufacturing an electronic part according to claim 1, wherein said support member is a substrate of said electronic part.

4. A method for manufacturing an electronic part according to claim 2, wherein a B-stage sheet is used as said insulating sheet.

5. A method for manufacturing an electronic part according to claim 3, wherein a B-stage sheet is used as said insulating sheet.

6. A method for manufacturing an electronic part according to claim 2, wherein a thermoplastic insulating sheet is used as said insulating sheet.

7. A method for manufacturing an electronic part according to claim 3, wherein a thermoplastic insulating sheet is used as said insulating sheet.

8. A method for manufacturing an electronic part according to claim 2, wherein heating is performed in addition to said pressing.

9. A method for manufacturing an electronic part according to claim 3, wherein heating is performed in addition to said pressing.

10. A method for manufacturing an electronic part according to claim 4, wherein heating is performed in addition to said pressing.

11. A method for manufacturing an electronic part according to claim 5, wherein heating is performed in addition to said pressing.

12. A method for manufacturing an electronic part according to claim 6, wherein heating is performed in addition to said pressing.

13. A method for manufacturing an electronic part according to claim 7, wherein heating is performed in addition to said pressing.

* * * * *